United States Patent
Kadotani et al.

(10) Patent No.: US 8,348,457 B2
(45) Date of Patent: Jan. 8, 2013

(54) LIGHTING DEVICE WITH LIGHT MODULATION FOR WHITE LIGHT

(75) Inventors: Norikazu Kadotani, Tsu (JP); Koichi Fukasawa, Fuefuki (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 436 days.

(21) Appl. No.: 12/625,846

(22) Filed: Nov. 25, 2009

(65) Prior Publication Data

US 2010/0134043 A1    Jun. 3, 2010

(30) Foreign Application Priority Data

Nov. 25, 2008    (JP) .................................. 2008-299591

(51) Int. Cl.
*F21V 9/16*    (2006.01)
*H01L 31/12*    (2006.01)

(52) U.S. Cl. .............................. 362/231; 362/84; 257/79

(58) Field of Classification Search .................... 362/84, 362/230, 231, 260, 294, 373; 257/88, 89, 257/79, 102

See application file for complete search history.

(56) References Cited

U.S. PATENT DOCUMENTS

| | | | |
|---|---|---|---|
| 6,127,783 A | | 10/2000 | Pashley et al. |
| 6,255,670 B1 * | | 7/2001 | Srivastava et al. ............... 257/89 |
| 6,515,417 B1 * | | 2/2003 | Duggal et al. ................. 313/506 |
| 6,577,073 B2 * | | 6/2003 | Shimizu et al. ............... 315/246 |
| 6,600,175 B1 * | | 7/2003 | Baretz et al. ................... 257/100 |
| 6,661,029 B1 * | | 12/2003 | Duggal ............................ 257/89 |
| 6,700,322 B1 * | | 3/2004 | Duggal et al. ................. 313/504 |
| 6,809,347 B2 * | | 10/2004 | Tasch et al. .................... 257/103 |
| 7,005,679 B2 * | | 2/2006 | Tarsa et al. ...................... 257/89 |
| 7,488,088 B2 * | | 2/2009 | Brukilacchio ................ 362/231 |
| 7,518,150 B2 | | 4/2009 | Aihara et al. |
| 7,564,180 B2 * | | 7/2009 | Brandes ......................... 313/501 |
| 7,768,192 B2 * | | 8/2010 | Van De Ven et al. ......... 313/503 |
| 7,847,302 B2 * | | 12/2010 | Basin et al. ..................... 257/88 |

FOREIGN PATENT DOCUMENTS

| | | |
|---|---|---|
| JP | 2002533870 | 10/2002 |
| JP | 2006245443 | 9/2006 |
| JP | 2008160061 | 7/2008 |
| WO | 0037904 A1 | 6/2000 |

* cited by examiner

*Primary Examiner* — Alan Cariaso

(74) *Attorney, Agent, or Firm* — Browdy and Neimark, PLLC

(57) ABSTRACT

In a lighting device, a first LED is formed by sealing a blue LED element by a first resin, the first resin having a first phosphor included in the first resin so as to raise a correlation color temperature of an emitted light color; and a second LED is formed by sealing a blue LED element by a second resin, the second resin having a second phosphor included in the second resin so as to lower a correlation color temperature of an emitted light color. The lighting device emits light from white light of a color having a first correlation color temperature to white light of a color having a second correlation color temperature, and the first correlation color temperature is higher than the second correlation color temperature. Consequently, various tones of white light can be more easily adjusted and controlled over a long period.

5 Claims, 4 Drawing Sheets

LIGHTING DEVICE WITH LIGHT MODULATION FOR WHITE LIGHT

CROSS REFERENCE TO THE RELATED APPLICATION

The application is based on and claims the priority benefit of Japanese Patent Application No. 2008-299591, filed on Nov. 25, 2008, the entire description of which is incorporated herein by reference.

BACKGROUND OF THE INVENTION

1. Field of the Invention

The present invention relates to a lighting device utilizing a light-emitting diode element (hereafter abbreviated to "LED element"), particularly to a lighting device with light modulation for white light.

2. Related Art Statement

Conventionally lighting devices for emitting white light are known; a lighting device in which a blue LED element and a green LED element are sealed by a sealing resin having a yellow phosphor and a red phosphor mixed in the resin, or a lighting device in which a blue LED element is sealed by a first separate sealing resin including a yellow phosphor and a green LED element is sealed by a second separate sealing resin including a red phosphor. (refer to Japanese Unexamined Patent Application Publication No. 2006-245443). To improve a light intensity and a color rendition in this lighting device, a color of white light is adjusted by utilizing two kinds of LED elements emitting lights of different color ranges in spectrum from each other and also by disposing two kinds of phosphors to receive lights from the respective LED elements that emit lights of different color ranges in spectrum and to convert the respective received lights into lights of different color ranges in spectrum from one another.

Also known is a lighting appliance including red, green and blue LED elements and configured to emit a desired white light by making adjustment to a current supply while measuring a light output of the appliance (refer, for example, to Japanese Unexamined Patent Application Publication (Translation of PCT Application) No. 2002-533870).

In addition, there is known a lighting device including a light-emitting diode (hereafter abbreviated to "LED") emitting white light and constituted by a blue LED element and a yellow phosphor, a red LED element, a green LED element, and a color temperature control device, and configured to control a color temperature by adjusting a current supplied to the red LED element and the green LED element (refer, for example, to Japanese Unexamined Patent Application Publication No. 2008-160061).

In the above-mentioned lighting device utilizing the two kinds of LED elements that emit lights of different color ranges in spectrum and the two kinds of phosphors, since the color of white light is adjusted by colors of lights emitted from the LED elements used and by a mix ratio of the phosphors in a sealing resin, the color of light from the lighting device is decided at a time of manufacture. Consequently, the color tone adjustments of white light during use of these lighting devices are not assumed.

Moreover, all of the above-described related art is attempting to obtain white light of a desired color by using a plurality of LED elements that emit lights of different color ranges in spectrum. However, there is a problem that if LED elements that emit lights of different color ranges in spectrum are used in this way, a forward drop voltage (VF) of each of the respective LED elements differs because of using different kinds of LED elements, and, consequently, in order to control a current supply to each of the LED elements, there is required a lighting circuit that takes account of the various forward drop voltages, and a circuit configuration becomes complicated.

In addition, there is a problem that if a plurality of kinds of LED elements that emit lights of different color ranges in spectrum from one another are used, a life span and speed of deterioration of each of the LED elements differs, and, consequently, with long-term use, emitted light color of a certain color becomes unobtainable.

SUMMARY OF THE INVENTION

An object of the present invention is to provide a lighting device in which a color of white light can be more easily adjusted and controlled over a long period.

To achieve the above-described object, a lighting device in accordance with an aspect of the present invention includes a first LED that has a plurality of first blue LED elements, a first resin sealing the plurality of blue LED elements, a first phosphor included in the first resin to receive a part of blue light from the first blue LED elements and emit first phosphor-converted light, the first LED emitting a first white light that comprises blue light from the first blue light-emitting diode elements and first phosphor-converted light, and the first white light having a first correlation color temperature; a second LED that has a plurality of second blue LED elements, a second resin sealing the plurality of second blue LED elements, a second phosphor included in the second resin to receive a part of blue light from the second blue LED elements and emit second phosphor-converted light, the second LED emitting a second white light that comprises blue light from the second blue LED elements and second phosphor-converted light, the second white light having a second correlation color temperature; and the first correlation color temperature being higher than the second correlation color temperature. Since the lighting device uses blue LED elements that emit lights of a same color range in spectrum for the first and second blue LED elements, it is easy to control the current supply to the LED elements.

Also, changing current supply to one of the first LED and the second LED or supplying both of the first LED and the second LED achieves various white lights emitted from a lighting device.

In an embodiment, the first LED emits a first white light of a daylight color, and the first white light has a first correlation color temperature of around 6500K to 7000K.

In an embodiment, the second LED emits a second white light of an electric light bulb color, and the second white light has a second correlation color temperature of around 2600K to 3000K.

The first phosphor is a yellow phosphor that receives a part of blue light emitted from the first blue LED elements and emits yellow fluorescent light, and the second phosphor is a red phosphor that receives a part of blue light emitted from the second blue LED elements and emits red fluorescent light.

DETAILED DESCRIPTION OF THE PREFERRED EMBODIMENTS

Preferred embodiments of the present invention are now described in detail with reference to the accompanying drawings.

Figure 1:
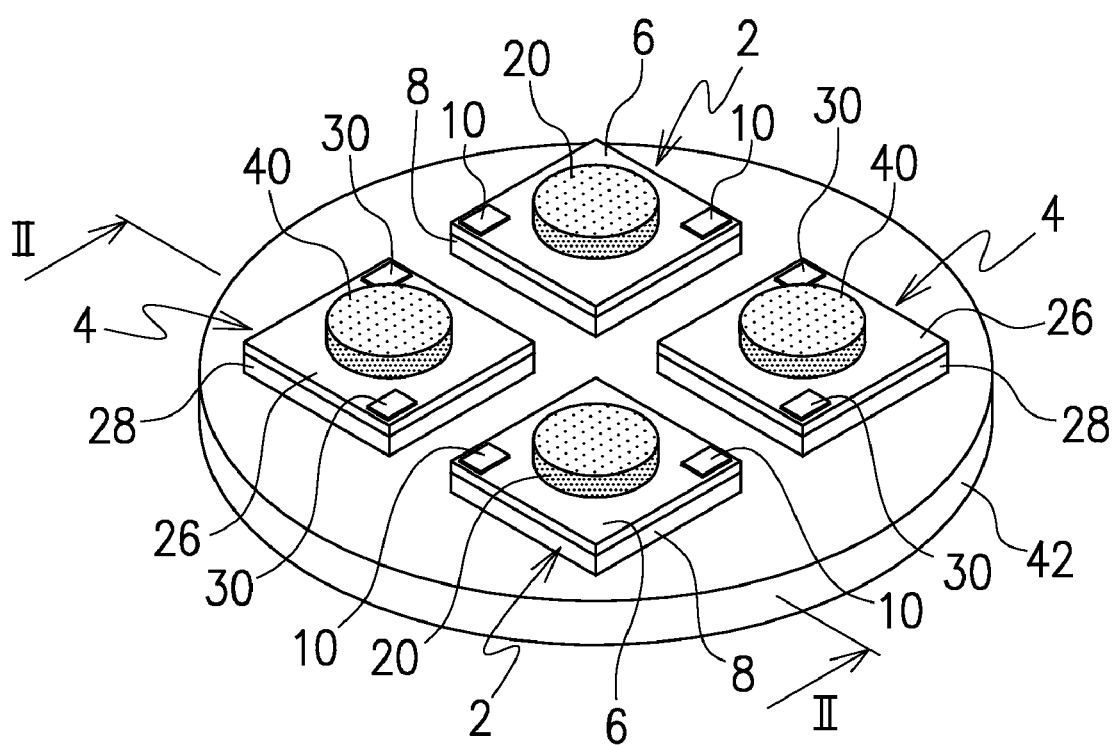
FIG. 1 is a perspective view showing a lighting device in accordance with a first embodiment of the present invention.
Figure 2:
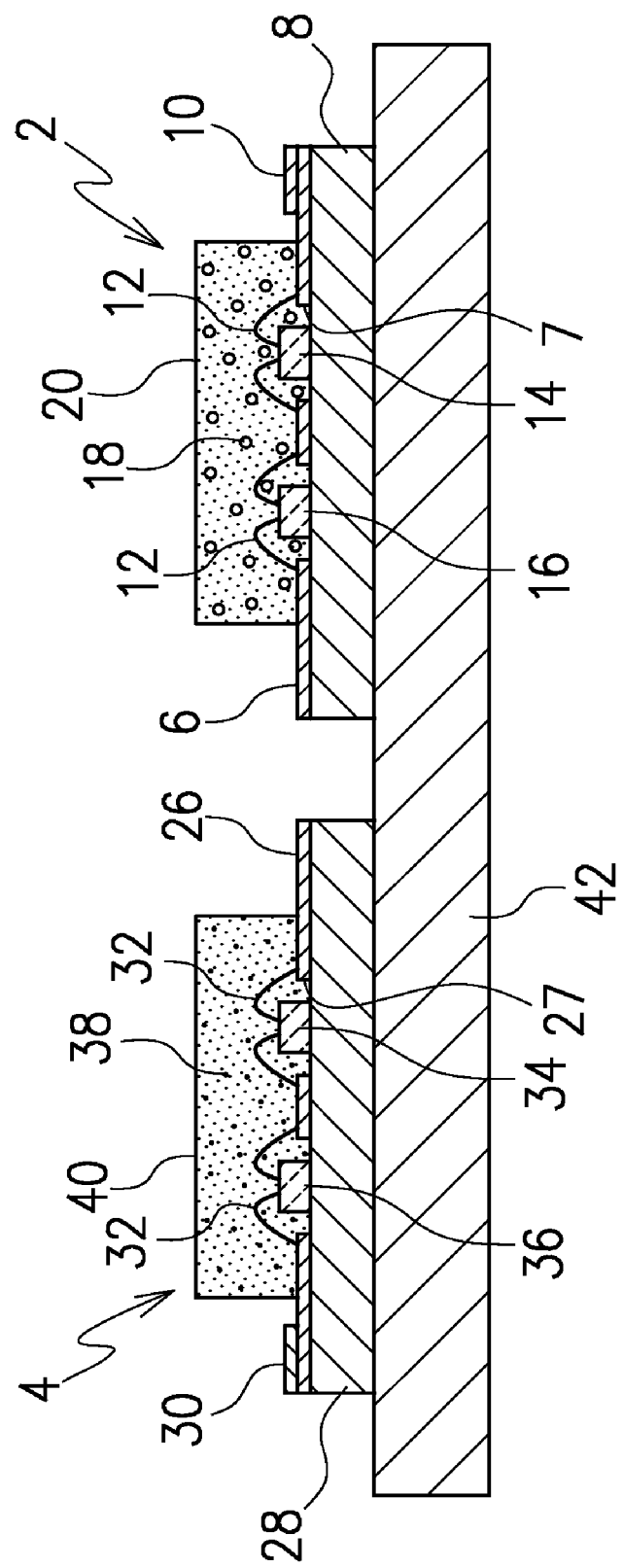
FIG. 2 is a cross-sectional view taken along a line II-II of the lighting device shown in FIG. 1.
Figure 3:
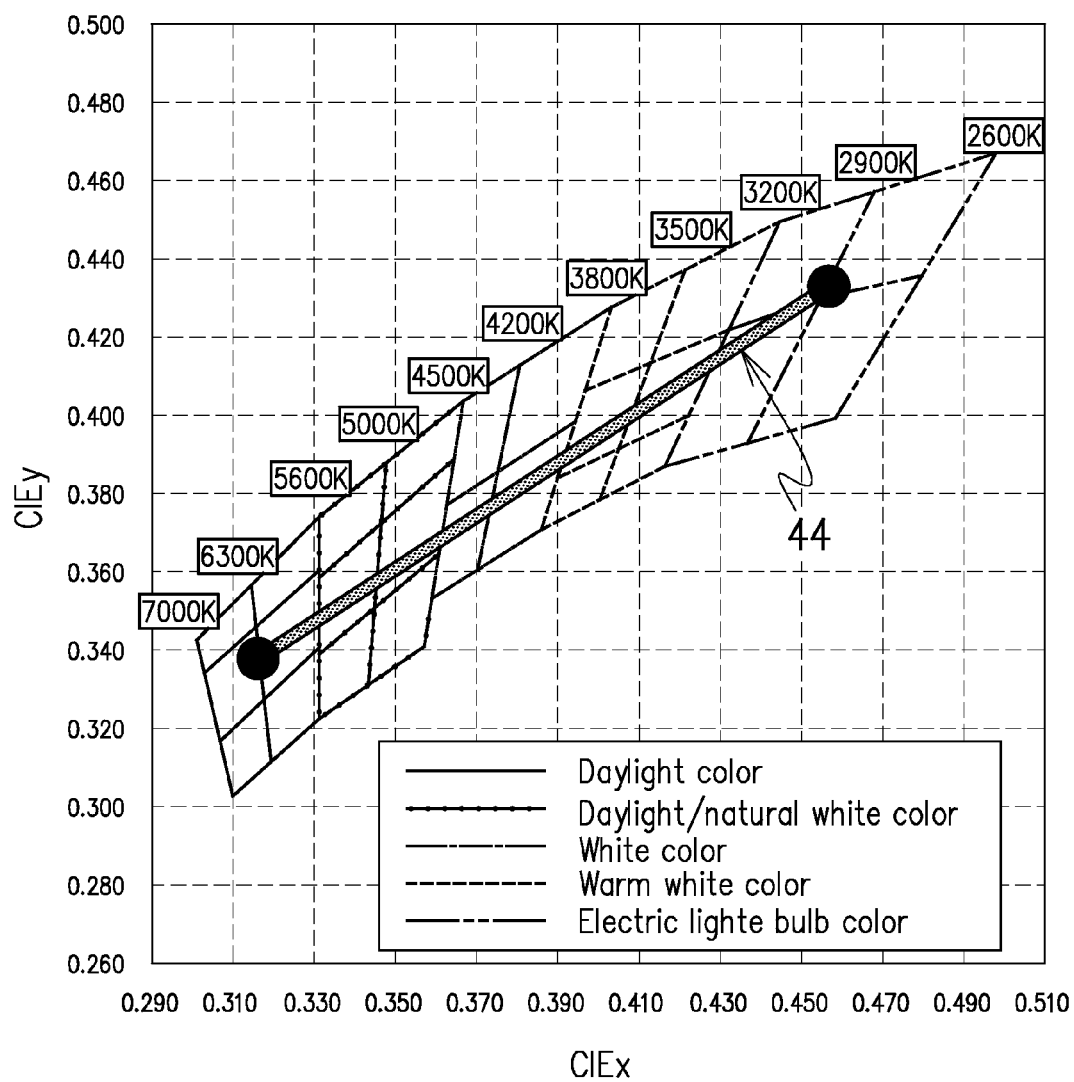
FIG. 3 is a chromaticity diagram showing colors of white light and a color of light emitted by the lighting device in the present invention.

FIG. 1 is a perspective view showing a lighting device in accordance with a first embodiment of the present invention, FIG. 2 is a cross-sectional view taken along a line II-II of FIG. 1, and FIG. 3 is a chromaticity diagram showing various colors of white light. A first LED 2 emits a first white light mixed by lights from an LED element and a first phosphor and having a high correlation color temperature, and a second LED 4 emits a second white light mixed by lights from an LED and a second phosphor and having a low correlation color temperature.

As shown in FIGS. 1 and 2, a first LED 2 includes a substrate 6 which is constituted from an insulating material such as glass epoxy, BT resin, ceramics, or metal core, and has a conductive pattern (not shown) formed on an upper surface of the substrate 6 and a pair of electrode pads 10 formed on the upper surface of the substrate 6 at two diagonally opposite corners; at least one blue LED element, here two blue LED elements 14 and 16 which are, for example, InGaN-based compound semiconductors and are electrically connected to the electrode pads 10 by gold wires 12 via the conductive pattern; and a first resin 20 which is constituted from a light-transmitting resin such as epoxy resin or silicone resin having a first phosphor 18 dispersed in the resin, and is configured to seal the blue LED elements 14 and 16.

The first phosphor 18 excited by blue light emitted by the blue LED elements 14 and 16 emits yellow light, and the blue light and the yellow light appear to be white light emitted from the first LED as a first white light having a high correlation color temperature by color mixing effect of the blue light and the yellow light. The first phosphor 18 in the present embodiment is a yellow phosphor such as YAG configured to receive the blue light from the blue LED elements 14 and 16 and emit yellow fluorescent light. The first LED 2 emits a first white light similar to the daylight color of around 6500K to 7000K in the chromaticity diagram shown in FIG. 3.

A second LED 4 includes a substrate 26 which is constituted from an insulating material and has a conductive pattern (not shown) formed on an upper surface of the substrate and a pair of electrode pads 30 formed on the upper surface of the substrate 26 at two diagonally opposite corners; at least one blue LED element, here two blue LED elements 34 and 36 provided and electrically connected to the electrode pads 30 by gold wires 32 via the conductive pattern; and a second resin 40 which is a light-transmitting resin having a second phosphor 38 dispersed in the second resin 40, and is configured to seal the blue LED elements 34 and 36, similarly to the first LED 2.

The second phosphor 38 excited by blue light emitted by the blue LED elements 34 and 36 emits red light, and the blue light and the red light appear to be white light emitted from the second LED as a second white light having a low correlation color temperature by color mixing effect of the blue light and the red light. The second phosphor 38 in the present embodiment is constituted from a red phosphor such as sialon configured to receive the blue light from the blue LED elements 34 and 36 and emit red fluorescent light. The second LED 4 emits a second white light similar to the electric light bulb color of around 2600K to 3000K in the chromaticity diagram shown in FIG. 3.

Note that the symbol 42 in FIGS. 1 and 2 indicates a case or a part of a lighting appliance or the like. In order to show clearly a configuration of the first and second LEDs 2 and 4, only a plate-like portion of the case 42 to which the first and second LEDs 2 and 4 are attached is shown. In the lighting device in the present embodiment, a large number of LEDs forming at least one pair, here two pairs, of the first LED 2 and the second LED 4 are attached to the case 42 with heat dissipation plates 8 and 28 made from aluminum for example directly in contact with the case 42. In the lighting device shown in FIG. 1, two pairs of the first and second LEDs 2 and 4 are attached to the case 42, but more pairs, several tens to several hundreds of pairs of the first and second LEDs 2 and 4 may be used to form a lighting appliance.

Moreover, in the present embodiment, the heat dissipation plates 8 and 28 are planar plates of a same square shape as the substrates 6 and 26 fixed to an upper surface of the heat dissipation plates 8 and 28. In addition, penetrating holes 7 and 27 are formed in the substrates 6 and 26, respectively, and the blue LED elements 14, 16, 34, and 36 are mounted on respective upper surfaces of the heat dissipation plates 8 and 28, the respective upper surfaces exposed in these penetrating holes 7 and 27.

Next, modulation of emitting light, and current-supply control of the LED elements are described. In this embodiment, a current is supplied to each of the electrode pads 10 and 30 of the first and second LEDs 2 and 4, respectively, and therefore, current-supply control from a control circuit to the first LED including the blue LED elements 14 and 16, and to the second LED including the blue LED elements 34 and 36, can be respectively controlled by a control circuit. When the blue LED elements 14 and 16 of the first LED 2 light up, the first phosphor 18 is excited by the blue light to emit yellow fluorescent light. This yellow fluorescent light and the blue light appear to be white light having a high correlation color temperature around 6500K to 7000K. Further, when the blue LED elements 34 and 36 of the second LED 4 light up, the second phosphor 38 is excited by the blue light to emit red fluorescent light. This red fluorescent light and the blue light appear to be white light having a low correlation color temperature around 2600K to 3000K.

As shown in FIG. 3, the correlation color temperature of the daylight color is around 6500K to 7000K, and, in contrast, the correlation color temperature of the electric light bulb color is around 2600K to 3000K. Consequently, if a current is supplied to only the first LED 2, white light emitted from the lighting device appears to have daylight color having a correlation color temperature around 6500K to 7000K can be emitted, and if a current is supplied to only the second LED 4, white light emitted from the lighting device appears to have a color of electric light bulb having a correlation color temperature around 2600K to 3000K.

Furthermore, if a current is supplied to the first and second LEDs 2 and 4 to emit white lights simultaneously, white lights having respective different spectrum ranges can be emitted. Accordingly, different color tones of white light such as the white light of the daylight color, the white light of the electric light bulb color, and the mixed color of both are available, since a drive current to the first and second LEDs 2 and 4 can be respectively controlled to adjust brightness of the LED elements included in the first and second LEDs 2 and 4.

Controlling the current supply to the first and second LEDs 2 and 4 in this way makes it possible to modulate different color tones of white light that lie on line 44 which covers the daylight color and the electric light bulb color as an upper and a lower limit, respectively, as shown in FIG. 3. The color lying on this line 44 includes the daylight color, a daylight/natural white color, a white color, a warm white color, and the electric light bulb color, and has a correlation color temperature of around 2600K to 7000K; these different color tones of white light can be arbitrarily modulated within this range.

Particularly, since the blue LED elements 14, 16, 34, and 36 used in the first and second LEDs 2 and 4 are all LED elements that emit lights of a same color range in spectrum, a forward drop voltage VF, a life span, and a speed of deterioration of the LED elements can be substantially identical. Consequently, even when a large number of LED elements are used, there is no need to consider the forward drop voltage and so on of each individual LED element when controlling the LED elements.

Note that, in order to obtain sufficient brightness as a lighting device, a plurality of blue LED elements are provided in each of the LEDs (two in the present embodiment), but the number can be set arbitrarily.

Figure 4:
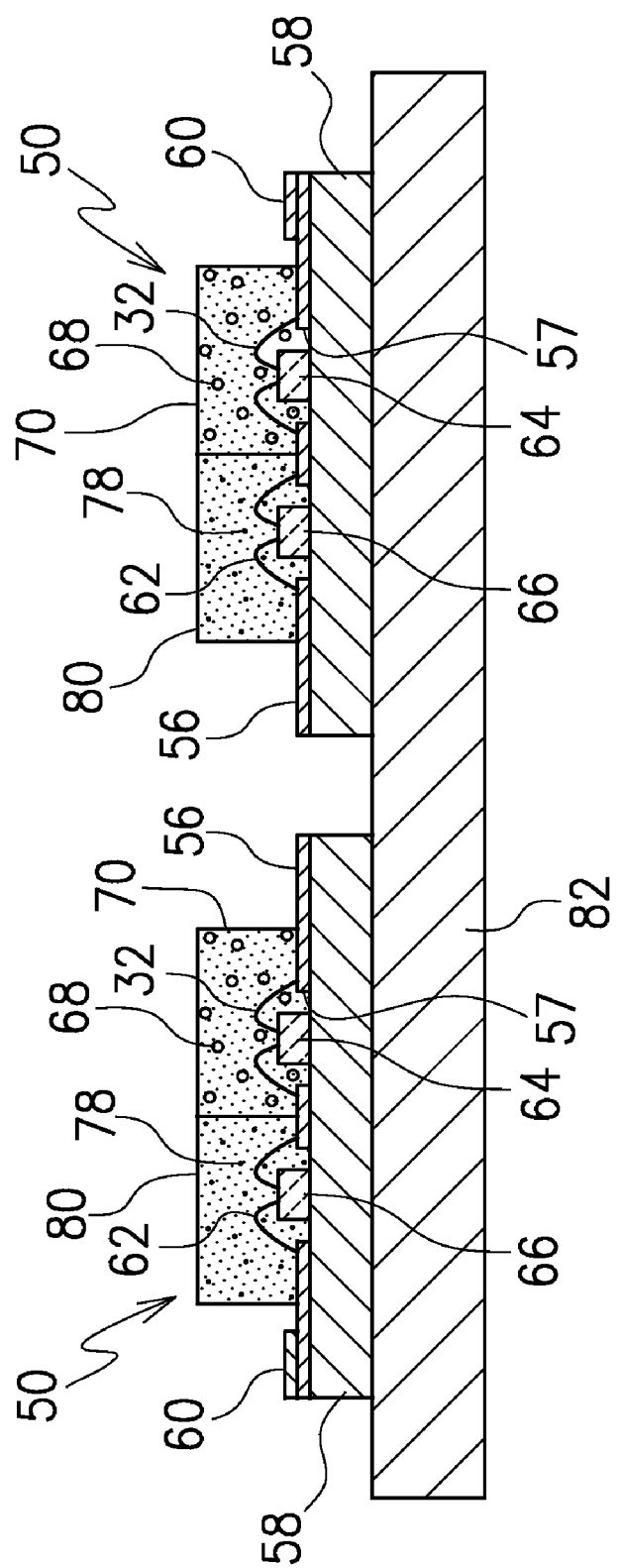
FIG. 4 is a cross-sectional view showing a lighting device in accordance with a second embodiment of the present invention.

FIG. 4 is a cross-sectional view showing a lighting device in accordance with a second embodiment of the present invention. The lighting device in the second embodiment is configured such that white light of the daylight color and white light of the electric light bulb color are emitted and undergo color mixing in a single LED (hereinafter referred to as a combination-LED).

A combination-LED 50 in the second embodiment includes a plurality of blue light-emitting diode elements, a first resin portion including a first phosphor and sealing a first portion of the plurality of blue light-emitting diode elements, and a second resin portion including a second phosphor and sealing a second portion of the plurality of blue light emitting diode elements, the first resin portion emitting a first white light having a first correlation color temperature, the second resin portion emitting a second white light having a second correlation color temperature, and the first correlation color temperature being higher than the second correlation color temperature. The plurality of blue LED elements 64 and 66 are electrically connected to a substrate 56 having a conductive pattern (not shown) and electrode pads 60 formed on a surface of the substrate; and here, the blue LED elements 64 and 66 are electrically connected to the electrode pads 60 by gold wires 62 via the conductive pattern, similarly to the aforementioned first and second LEDs 2 and 4 in the first embodiment.

On the other hand, the combination-LED 50 in the second embodiment differs from the aforementioned first and second LEDs 2 and 4 in the first embodiment in having a blue LED element 64 sealed by a first resin 70 which is constituted from a light-transmitting resin having a first phosphor 68 dispersed in the first resin 70, and a blue LED element 66 sealed by a second resin 80 which is constituted from a light-transmitting resin having a second phosphor 78 dispersed in the second resin 80.

The first phosphor 68 in the second embodiment is constituted from the same yellow phosphor as the first phosphor 18 in the first embodiment; the first phosphor 68 is excited by blue light from the blue LED element 64 to generate fluorescent light, and, by color mixing of the thus-generated fluorescent light with the blue light from the blue LED element 64, turns the blue light from the blue LED element 64 into white light of a color of daylight color having a high correlation color temperature of around 6500K to 7000K. Further, the second phosphor 78 is constituted from the same red phosphor as the second phosphor 38 in the first embodiment; the second phosphor 78 is excited by blue light from the blue LED element 66 to generate fluorescent light, and, by color mixing of the thus-generated fluorescent light with the blue light from the blue LED element 66, turns the blue light from the blue LED element 66 into white light of a color of electric light bulb color having a low correlation color temperature of around 2600K to 3000K.

Moreover, a case 82 of a lighting appliance or the like is similar to the case 42 in the first embodiment. A plurality of combination-LEDs 50 having the above-described configuration are attached to the case 82 in the second embodiment, with heat dissipation plates 58 constituted from a square of an identical shape to the substrate 56 interposed therebetween. Note that, in the second embodiment also, the blue LED elements 64 and 66 are respectively mounted on an exposed upper surface of the heat dissipation plates 58 in penetrating holes 57 formed in the substrate 56.

In a case of the lighting device of the second embodiment having the above-described configuration, a current is supplied from a control circuit to the blue LED elements 64 and 66, respectively, whereby the blue LED elements 64 and 66 are respectively light-up controlled. When the blue LED elements 64 and 66 light up, the first phosphor 68 and the second phosphor 78 are excited, respectively, by the blue light to emit yellow fluorescent light and red fluorescent light, respectively. The yellow fluorescent light with the blue light produces white light of the daylight color having a high correlation color temperature and the red fluorescent light with the blue light produces white light of the electric light bulb color having a low correlation color temperature.

As described above, the combination-LED 50 emits both of white light of the daylight color and white light of the electric light bulb color. Consequently, light emitted by the combination-LED 50 may become white light of an arbitrary color in a range of correlation color temperature of around 2600K to 7000K, due to white light of the daylight color and white light of the electric light bulb color, or due to color mixing of those white lights.

Note that, in the combination-LED 50 shown, one each of blue LED elements are sealed by the first and second resins 70 and 80; however, in order to obtain a sufficient brightness, a plurality of blue LED elements may also be sealed, respectively.

Moreover, it is also possible to attach to the cases 42 and 82 both of the first and second LEDs 2 and 4 in the first embodiment and the combination-LED 50 in the second embodiment.

As described above, the present invention includes a first LED and a second LED using the blue LED elements that emit lights of a same color range in spectrum, and the first LED is configured to emit white light having a high correlation color temperature and the second LED is configured to emit white light having a low correlation color temperature. Consequently, in the lighting device of the present invention, by lighting up only one of the first LED and the second LED or by lighting up and controlling both of the first LED and the second LED, it is possible to emit light from the white light of a color having a high correlation color temperature to the white light of a color having a low correlation color temperature. The lighting device of the present invention having the above-described configuration uses the blue LED elements that emit lights of a same color range in spectrum for the first LED and the second LED, and thus a forward drop voltage applied to all LED elements used can be substantially identical. As a result, light-up control can be carried out simply using only a current, without the need to execute a complicated light-up control that considers the forward drop voltage of each of the LED elements.

Moreover, in the lighting device of the present invention that includes the combination-LEDs configured to emit white light of a color having a high correlation color temperature and white light of a color having a low correlation color temperature, there is likewise no need to execute a complicated light-up control, since all the same blue LED elements are used, similarly to the above.

Furthermore, by using blue LED elements that emit lights of a same color range in spectrum for the present invention, the life span and speed of deterioration of the LED elements can be made substantially the same, and even in long-term use, there is no drop in performance due to a portion of the LED elements deteriorating sharply. Consequently, reliability in long-term use can be increased.

In addition, in a case that white light of a color having a high correlation color temperature is set to daylight color of around 6500K to 7000K and white light of a color having a low correlation color temperature is set to electric light bulb color of around 2600K to 3000K, a color of white light in a JIS standard range of around 2600K to 7000K, a daylight color, a daylight/natural white color, a white color, a warm white color, and an electric light bulb color can be easily obtained by color mixing of one white light with another white light. In particular, since the LED elements emit lights of a same color range in spectrum, it is easy to control a current supply to the LED elements and to obtain a desired white light.

Moreover, in a case of the combination-LEDs configured to emit white light of a color having a high correlation color temperature and white light of a color having a low correlation color temperature, it is possible to facilitate color mixing and at the same time achieve miniaturization with various white tones of light.

Preferred embodiments of the present invention have been described, but the present invention is not limited to these embodiments and it should be understood that various modifications and alterations may be made to the embodiments.

What is claimed is:

1. A lighting device, comprising:
a plurality of first light-emitting diodes each including a plurality of first blue light-emitting diode elements, a first resin sealing the plurality of blue light-emitting diode elements, a first phosphor included in the first resin to receive a part of blue light from the first blue light-emitting diode elements and emit first phosphor-converted light, the plurality of first light-emitting diodes each emitting a first white light that comprises blue light from the first blue light-emitting diode elements and first phosphor-converted light, and the first white light having a first correlation color temperature;
a plurality of second light-emitting diodes each including a plurality of second blue light-emitting diode elements, a second resin sealing the plurality of second blue light-emitting diode elements, a second phosphor included in the second resin to receive a part of blue light from the second blue light-emitting diode elements and emit second phosphor-converted light, the plurality of second light-emitting diodes each emitting a second white light that comprises blue light from the second blue light-emitting diode elements and second phosphor-converted light, the second white light having a second correlation color temperature;
a heat dissipation plate; and
the plurality of first light-emitting diodes and the plurality of second light-emitting diodes being provided in pairs with respect to each other,
one of the first light-emitting diodes and one of the second light-emitting diodes in one of the pairs being mounted on the heat dissipation plate as a combination light-emitting diode, and
the first correlation color temperature being higher than the second correlation color temperature.

2. The lighting device according to claim 1:
wherein a current supply to the first blue light-emitting diode elements and a current supply to the second blue light-emitting diode elements are controlled separately by a control circuit.

3. The lighting device according to claim 1:
wherein the first white light is white light of a daylight color, and
the second white light is white light of an electric light bulb color.

4. The lighting device according to claim 1:
wherein the first white light having the first correlation color temperature ranges around 6500K to 7000K, and
the second white light having the second correlation color temperature ranges around 2600K to 3000K.

5. The lighting device according to claim 1:
wherein the first phosphor is a yellow phosphor to receive blue light and emit yellow fluorescent light, and
the second phosphor is a red phosphor to receive blue light and emit red fluorescent light.

* * * * *